US012606432B2

(12) United States Patent
Ding

(10) Patent No.: US 12,606,432 B2
(45) Date of Patent: Apr. 21, 2026

(54) MEMS DEVICE WITH MOVABLE ELECTRODE PLATE AND FEEDBACK CAPACITOR

(71) Applicant: Zhunmao (Hangzhou) Technology Co., Hangzhou (CN)

(72) Inventor: Haitao Ding, Hangzhou (CN)

(73) Assignee: Zhunmao (Hangzhou) Technology Co., Hangzhou (CN)

( * ) Notice: Subject to any disclaimer, the term of this patent is extended or adjusted under 35 U.S.C. 154(b) by 362 days.

(21) Appl. No.: 18/358,133

(22) Filed: Jul. 25, 2023

(65) Prior Publication Data

US 2024/0025734 A1 Jan. 25, 2024

(30) Foreign Application Priority Data

Jul. 25, 2022 (CN) .......................... 202210875328.2

(51) Int. Cl.
*B81B 7/00* (2006.01)
*G01C 19/56* (2012.01)
(Continued)

(52) U.S. Cl.
CPC .............. *B81B 7/008* (2013.01); *G01C 19/56* (2013.01); *G01C 19/5776* (2013.01);
(Continued)

(58) Field of Classification Search
CPC ........ G01P 15/125; G01P 15/08; G01P 15/18; G01P 2015/0814; G01C 19/56; G01D 5/241
See application file for complete search history.

(56) References Cited

U.S. PATENT DOCUMENTS

| 5,194,819 A | 3/1993 | Breifer |
| 5,281,901 A | 1/1994 | Yardley et al. |
| (Continued) | | |

FOREIGN PATENT DOCUMENTS

| CN | 1948906 A | 4/2007 |
| CN | 103308720 A | 9/2013 |
| (Continued) | | |

OTHER PUBLICATIONS

Translation of CN104614552.*
(Continued)

*Primary Examiner* — Helen C Kwok
(74) *Attorney, Agent, or Firm* — Westman, Champlin & Kochler, P.A.

(57) ABSTRACT

Disclosed is a MEMS device, comprising: a movable electrode plate; a first electrode plate and a first feedback electrode plate located on a first side of the movable electrode plate; a second electrode plate and a second feedback electrode plate located on a second side of the movable electrode plate. The first electrode plate, the first feedback electrode plate, the second electrode plate, the second feedback electrode plate respectively form a first capacitor, a first feedback capacitor, a second capacitor and a second feedback capacitor with the movable electrode plate. The first and the second capacitors are coupled to a detection circuit for performing differential detection on the first and the second capacitors; the first feedback capacitor and the second feedback capacitor are coupled to a feedback circuit for eliminating nonlinear relationship between an output voltage of the detection circuit and a displacement of the movable electrode plate.

18 Claims, 8 Drawing Sheets

200

(51) Int. Cl.

| | | |
|---|---|---|
| *G01C 19/5776* | (2012.01) | |
| *G01D 5/241* | (2006.01) | |
| *G01P 15/08* | (2006.01) | |
| *G01P 15/125* | (2006.01) | |
| *G01P 15/18* | (2013.01) | |

(52) U.S. Cl.

CPC .............. *G01D 5/241* (2013.01); *G01P 15/08* (2013.01); *G01P 15/125* (2013.01); *G01P 15/18* (2013.01); *B81B 2201/0235* (2013.01); *B81B 2201/0242* (2013.01); *B81B 2203/04* (2013.01); *B81B 2207/03* (2013.01); *G01P 2015/0865* (2013.01)

(56) References Cited

U.S. PATENT DOCUMENTS

| | | | |
|---|---|---|---|
| 5,451,940 | A | 9/1995 | Schneider et al. |
| 5,540,095 | A * | 7/1996 | Sherman ............... G01P 15/131 73/514.32 |
| 6,323,660 | B1 | 11/2001 | Kunc et al. |
| 6,386,032 | B1 * | 5/2002 | Lemkin ................. G01P 15/131 73/514.32 |
| 6,868,726 | B2 | 3/2005 | Lemkin et al. |
| 7,401,515 | B2 * | 7/2008 | Weber ................. G01C 19/5726 73/504.12 |
| 2001/0032508 | A1 * | 10/2001 | Lemkin ................. G01P 15/125 73/514.32 |
| 2005/0218911 | A1 * | 10/2005 | Denison ................ G01P 15/125 324/661 |
| 2008/0173091 | A1 * | 7/2008 | McNeil ................. G01P 15/125 73/514.32 |
| 2011/0174074 | A1 | 7/2011 | Li et al. |
| 2013/0006559 | A1 | 1/2013 | Grosjean et al. |
| 2014/0210547 | A1 | 7/2014 | Tomioka et al. |
| 2017/0089947 | A1 * | 3/2017 | Townsend ............. G01P 15/125 |
| 2018/0364275 | A1 | 12/2018 | Tao et al. |
| 2022/0224348 | A1 | 7/2022 | Perrott et al. |

FOREIGN PATENT DOCUMENTS

| | | | |
|---|---|---|---|
| CN | 103986472 A | | 8/2014 |
| CN | 104596496 A | | 5/2015 |
| CN | 104614552 A | * | 5/2015 |
| CN | 107085124 A | | 8/2017 |
| CN | 108362910 A | | 8/2018 |
| CN | 112600543 A | | 4/2021 |
| CN | 113534109 A | | 10/2021 |
| CN | 114280330 A | | 4/2022 |
| CN | 114509579 A | | 5/2022 |
| CN | 115201516 A | | 10/2022 |
| CN | 117490732 A | | 2/2024 |
| TW | 200828779 A | | 7/2008 |

OTHER PUBLICATIONS

Translation of Chinese Office Action for Chinese Application No. 2022108757932, dated May 21, 2024, 14 pages.

Translation of Chinese Office Action for Chinese Application No. 2022108753282, dated May 17, 2025, 24 pages.

Ding et al., A High-Resolution Silicon-on-Glass Z Axis Gyroscope Operating at Atmospheric Pressure, IEEE Sensors Journal, vol. 10, No. 6, p. 1066-1074, 2010.

Lui et al., Design and Fabrication of a lateral axis Gyroscope with Asymmetric Comb-Fingers as Sensing Capacitors, Proceedings of the 1st IEEE International Conference on Nano/Micro Engineered and Molecular Systems, p. 762-765, 2006.

Notice of Allowance for U.S. Appl. No. 18/358,125, dated Oct. 23, 2025, 17 pages.

* cited by examiner

100

- prior art -

- prior art -

200

210

400

410

510

MEMS DEVICE WITH MOVABLE ELECTRODE PLATE AND FEEDBACK CAPACITOR

CROSS-REFERENCE TO RELATED APPLICATION

The present application claims priority to Chinese patent application No. 202210875328.2, filed on Jul. 25, 2022, and entitled "MEMS DEVICE", which is incorporated herein by reference in its entirety.

FIELD OF THE DISCLOSURE

The present disclosure relates to a technical field of semiconductor technologies, in particular to a MEMS device.

DESCRIPTION OF THE RELATED ART

Parallel plate capacitors are easy to be fabricated, have high sensitivity, wide temperature range, are capable to respond to DC signals, and have little change after impact, thus they are widely used in designs of Micro-Electro-Mechanical System (MEMS) sensors. In order to suppress a common mode signal and ensure symmetry of a scale factor, a differential parallel plate capacitor has more practicality. However, capacitance change of a parallel plate capacitor is nonlinear with a displacement between the parallel plates of the capacitor, thus signal detection is also nonlinear; and with an increase of the displacement between electrode plates of the capacitor, nonlinearity also increases, which seriously affects detection accuracy.

SUMMARY

In view of the above problems, an objective of the present disclosure is to provide a MEMS device, so as to eliminate nonlinearity of parallel plate capacitor detection.

According to embodiments of the present disclosure, a MEMS device is provided and comprises:

a movable electrode plate;

a first electrode plate and a first feedback electrode plate, both of which are located on a first side of the movable electrode plate, wherein a first capacitor is formed by the first electrode plate and the movable electrode plate, and a first feedback capacitor is formed by the first feedback electrode plate and the movable electrode plate;

a second electrode plate and a second feedback electrode plate, both of which are located on a second side of the movable electrode plate, wherein a second capacitor is formed by the second electrode plate and the movable capacitor, and a second feedback capacitor is formed by the second feedback electrode plate and the movable electrode plate;

wherein, the first capacitor and the second capacitor are coupled to a detection circuit, and the detection circuit is configured to perform differential detection on the first capacitor and the second capacitor;

wherein the first feedback capacitor and the second feedback capacitor are coupled to a feedback circuit, and the feedback circuit is configured to eliminate a nonlinear relationship between an output voltage of the detection circuit and a displacement of the movable electrode plate.

In some embodiments, each of the first electrode plate and the second electrode plate has an equal overlapped area to the movable electrode plate; each of the first feedback electrode plate and the second feedback electrode plate has an equal overlapped area to the movable electrode plate; when the movable electrode plate is in a nominal position, distance between the movable electrode plate and each of the first electrode plate, the second electrode plate, the first feedback electrode plate and the second feedback electrode plate is equal.

In some embodiments, the detection circuit comprises:

a first voltage source, connected to the first electrode plate for supplying a first voltage to the first capacitor;

a second voltage source, connected to the second electrode plate for supplying a second voltage to the second capacitor; and an operational amplifier, having an inverting input terminal connected to the movable electrode plate.

In some embodiments, the first feedback electrode plate and the second feedback electrode plate are both connected to an output terminal of the operational amplifier, so as to form the feedback circuit.

In some embodiments, the first voltage and the second voltage are AC high frequency carriers, and are equal in amplitude and opposite in phase.

In some embodiments, the MEMS device further comprises:

an electronic analog switch, configured for timing control; and a sample-and-hold device, configured for sampling and holding an output voltage of the operational amplifier.

In some embodiments, the electronic analog switch includes a plurality of first electronic analog switches and a plurality of second electronic analog switches, wherein the plurality of first electronic analog switches are identical in timing and the plurality of second electronic analog switches are identical in timing.

In some embodiments, the plurality of first electronic analog switches are respectively connected between the first voltage source and the first capacitor, between the second voltage source and the second capacitor, and between the inverting input terminal and the output terminal of the operational amplifier; the plurality of second electronic analog switches are respectively connected between the first capacitor and ground, between the second capacitor and ground, and between the output terminal of the operational amplifier and a non-inverting input terminal of the sample-and-hold device.

In some embodiments, the first voltage and the second voltage are constant voltages, and the first voltage and the second voltage are equal in amplitude and are opposite in phase.

In some embodiments, the MEMS device further includes a third feedback electrode plate and a fourth feedback electrode plate;

the movable electrode plate comprises:

a first movable electrode plate, forming the first capacitor with the first electrode plate and forming the second capacitor with the second electrode plate;

a second movable electrode plate, forming the first feedback capacitor with the first feedback electrode plate and forming the second feedback capacitor with the second feedback electrode plate;

a third movable electrode plate, forming a third feedback capacitor with the third feedback electrode plate and forming a fourth feedback capacitor with the fourth feedback electrode plate;

wherein, the first movable electrode plate, the second movable electrode plate and the third movable electrode plate are separated from each other and move synchronously.

In some embodiments, each of the first electrode plate and the second electrode plate has an equal overlapped area to the first movable electrode plate; an overlapped area between the second movable electrode plate and each of the first feedback electrode plate and the second feedback electrode plate is equal to an overlapped area between the third movable electrode plate and each of the third feedback electrode plate and the fourth feedback electrode plate; when the movable electrode plate is in a nominal position, distance between the movable electrode plate and each of the first electrode plate, the second electrode plate, the first feedback electrode plate, the second feedback electrode plate, the third feedback electrode plate and the fourth feedback electrode plate is equal.

In some embodiments, the detection circuit comprises:
a voltage source, connected to the first movable electrode plate for supplying a voltage to the first capacitor and the second capacitor;
a first operational amplifier, having an inverting input terminal connected to the first electrode plate;
a second operational amplifier, having an inverting input terminal connected to the second electrode plate; and
a third operational amplifier, having a non-inverting input terminal connected to an output terminal of the first operational amplifier and having an inverting input terminal connected to an output terminal of the second operational amplifier.

In some embodiments, the first feedback electrode plate and the second feedback electrode plate are connected to the output terminal or the inverting input terminal of the first operational amplifier, and the second movable electrode plate is correspondingly connected to the inverting input terminal or the output terminal of the first operational amplifier, so as to form a first feedback circuit;
the third feedback electrode plate and the fourth feedback electrode plate are connected to the output terminal or the inverting input terminal of the second operational amplifier, and the third movable electrode plate is correspondingly connected to the inverting input terminal or the output terminal of the second operational amplifier, so as to form a second feedback circuit.

In some embodiments, the first electrode plate and the first feedback electrode plate are separated from each other or connected through an insulating medium; the second electrode plate and the second feedback electrode plate are separated from each other or connected through an insulating medium.

In some embodiments, the MEMS device is a MEMS accelerometer or a MEMS gyroscope.

In the MEMS device provided according to embodiments of the present disclosure, a feedback capacitor is introduced and linked with the parallel plate detection capacitor in a MEMS sensing element of the device, and the feedback capacitor is coupled into the feedback circuit, which greatly improves the linearity of differential parallel plate capacitor detection, especially when there is a large displacement of parallel plate leading to strong nonlinearity. Embodiments of the present disclosure may decrease nonlinearity significantly, and can be simply implemented and have strong feasibility.

Furthermore, the introduced feedback capacitor in the MEMS device according to embodiments of the present disclosure and the parallel plate detection capacitor in the prior device may be identical in material, structure form and fabrication process, and may have identical temperature coefficient, thus temperature drift of capacitor-voltage conversion can be reduced.

Furthermore, the MEMS device according to embodiments of the present disclosure can be a micro-electromechanical accelerometer, a micro-electro-mechanical gyroscope or the like, and has a wide application range.

BRIEF DESCRIPTION OF THE DRAWINGS

The above and other objects, features and advantages of the present disclosure will become more apparent from the following description of embodiments of the present disclosure with reference to accompanying drawings. It should be apparent that the drawings described below relate only to some embodiments of the present disclosure and are not a limitation of the present disclosure. In the drawings.

DETAILED DESCRIPTION OF EMBODIMENTS OF THE DISCLOSURE

Figure 1:
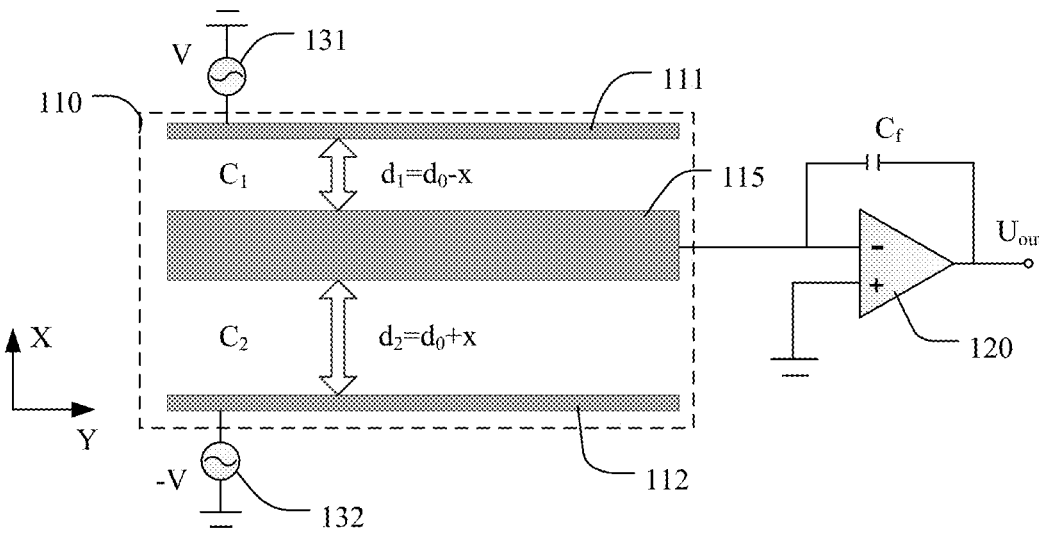
FIG. 1 shows a schematic diagram of a MEMS device according to the prior art.

The present invention will be described in more detail below with reference to the accompanying drawings. Throughout the various figures, like elements are denoted by like reference numerals. For the sake of clarity, various parts in the drawings are not drawn to scale. In addition, some well-known parts may not be shown.

The present disclosure may be presented in various forms, some examples of which will be described below.

Figure 2:
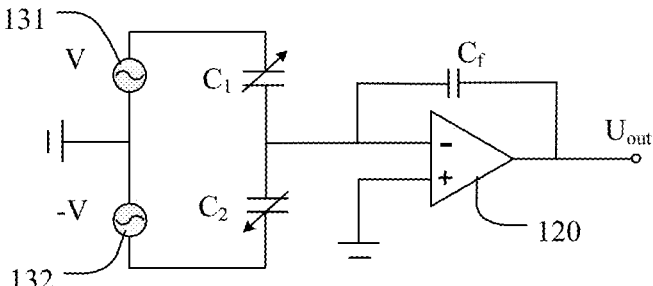
FIG. 2 shows an equivalent circuit diagram of a MEMS device according to the prior art.

FIG. 1 shows a schematic diagram of a MEMS device according to the prior art and FIG. 2 shows an equivalent circuit of a MEMS device according to the prior art.

As shown in FIG. 1, the MEMS device 100 includes a parallel plate capacitor 110, an operational amplifier 120, a first voltage source 131, a second voltage source 132 and a feedback capacitor $C_f$. The parallel plate capacitor 110 includes a movable electrode plate 115, a first electrode plate 111 on one side of the movable electrode plate 115, and a second electrode plate 112 on the other side of the movable electrode plate 115.

A first capacitor $C_1$, is constituted by the first electrode plate 111 and the movable electrode plate 115, and a second capacitor $C_2$ is constituted by the second electrode plate 112 and the movable electrode plate 115. When the movable electrode plate 115 is in the nominal position, the distance between the first electrode plate 111 and the movable electrode plate 115 and the distance between the second electrode plate 112 and the movable electrode plate 115 are both equal to do; an overlapped area between the first electrode plate 111 and the movable electrode plate 115 and an overlapped area between the second electrode plate 112 and the movable electrode plate 115 are both equal to $A_0$; that is, capacitance of the first capacitor $C_1$ and capacitance of the second capacitor $C_2$ are both equal to $C_0$. The first voltage source 131 is configured to supply a first voltage to the first capacitor $C_1$, and the second voltage source 132 is configured to supply a second voltage to the second capacitor $C_2$. The first voltage and the second voltage are AC high frequency carriers, and are identical in amplitude and are opposite in phase.

When the movable electrode plate 115 is displaced in a first direction (for example, X-axis direction), the distance between the movable electrode plate 115 and the first electrode plate 111 and the distance between the movable electrode plate 115 and the second electrode plate 112 change, thereby causing the capacitances of the first capacitor $C_1$ and the second capacitor $C_2$ to change.

Further, the movable electrode plate 115 is connected to an inverting input terminal of the operational amplifier 120, and the first electrode plate 111 is connected to the first voltage source 131, such that two ends of the first capacitor $C_1$ are connected between the first voltage source 131 and the inverting input terminal of the operational amplifier 120; the second electrode plate 112 is connected to the second voltage source 132, such that two ends of the second capacitor $C_2$ are connected between the second voltage source 132 and the inverting input terminal of the operational amplifier 120; the feedback capacitor $C_f$ is connected between the inverting input terminal and an output terminal of the operational amplifier 120, and the first capacitor $C_1$ and the second capacitor $C_2$ are connected to form an equivalent circuit as shown in FIG. 2.

As shown in FIG. 2, an output voltage $U_{out}$ at the output terminal of the operational amplifier is:

$$U_{out} = -\frac{C_1 - C_2}{C_f} V$$

Wherein when the movable electrode plate 115 is in a nominal position, the capacitance of the first capacitor $C_1$ and the capacitance of the second capacitor $C_2$ are equal, and the output voltage $U_{out}$ is 0.

When the movable electrode plate 115 is displaced along the first direction (e.g., the X-axis direction), the capacitances of the first capacitor $C_1$ and the second capacitor $C_2$ may change. For example, when the movable electrode plate 115 is, for example, moved in a direction toward the first electrode plate 111 by a displacement x, the distance between the movable electrode plate 115 and the first electrode plate 111 is $d_0-x$, and the capacitance of the first capacitor $C_1$ is:

$$C_1 = \frac{\varepsilon A_0}{d_0 - x};$$

Wherein $\varepsilon$ represents permittivity between the first electrode plate 111 and the movable electrode plate 115. Meanwhile, the distance between the movable electrode plate 115 and the second electrode plate 112 is $d_0+x$, and the capacitance of the second capacitor $C_2$ is:

$$C_2 = \frac{\varepsilon A_0}{d_0 + x};$$

Wherein $\varepsilon$ represents permittivity between the second electrode plate 112 and the movable electrode plate 115.

The output voltage $U_{out}$ at the output terminal of the operational amplifier 120 is:

$$U_{out} = -\frac{C_1 - C_2}{C_f} V = -\frac{\dfrac{\varepsilon A_0}{d_0 - x} - \dfrac{\varepsilon A_0}{d_0 + x}}{C_f} V = -\frac{2\varepsilon A_0 V}{C_f} \frac{x}{(d_0 - x)(d_0 + x)}$$

The feedback capacitor $C_f$ is an external fixed capacitor. From the above formula, it can be seen that capacitance of the parallel plate capacitor is changed with the distance nonlinearly, such that the output voltage is also changed with the distance nonlinearly, and with an increasing change of the distance, nonlinearity also increases, which seriously affects detection accuracy.

Figure 3:
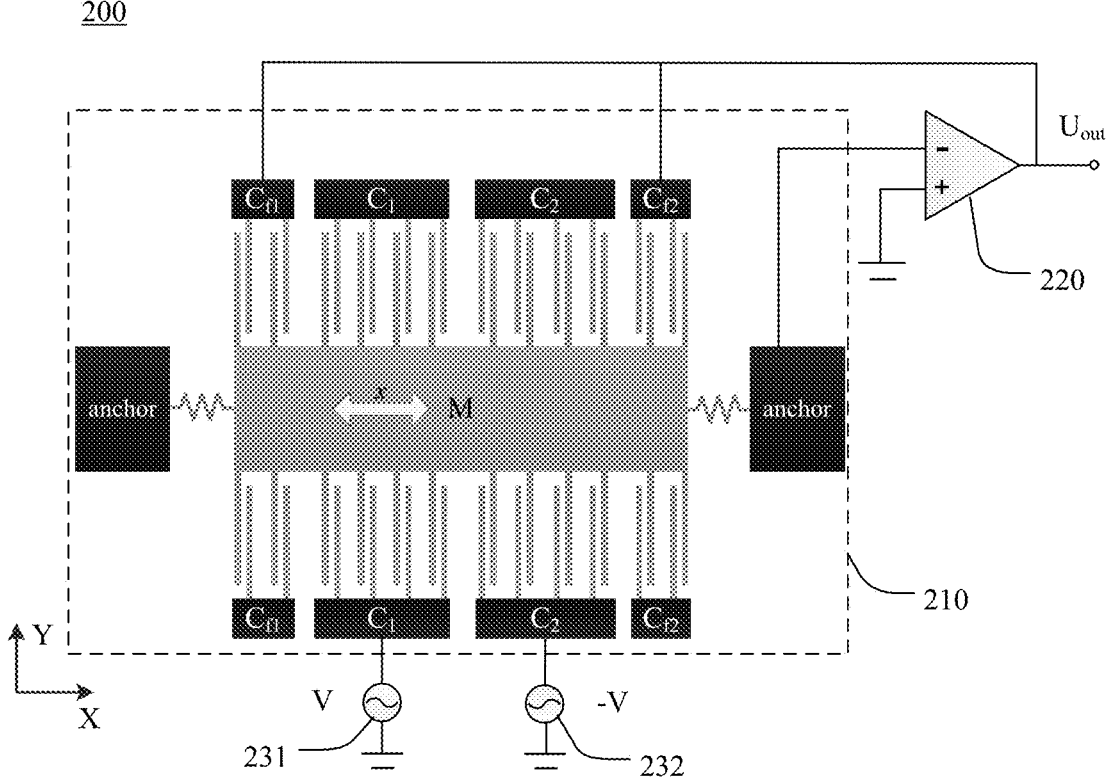
FIG. 3 shows a schematic diagram of a MEMS device according to a first embodiment of the present disclosure.

FIG. 3 shows a schematic diagram of a MEMS device according to a first embodiment of the present disclosure. In this embodiment, the MEMS device is, for example, a MEMS accelerometer. As shown in FIG. 3, the MEMS device 200 includes an acceleration sensing element 210, an operational amplifier 220, a first voltage source 231 and a second voltage source 232.

Figure 4:
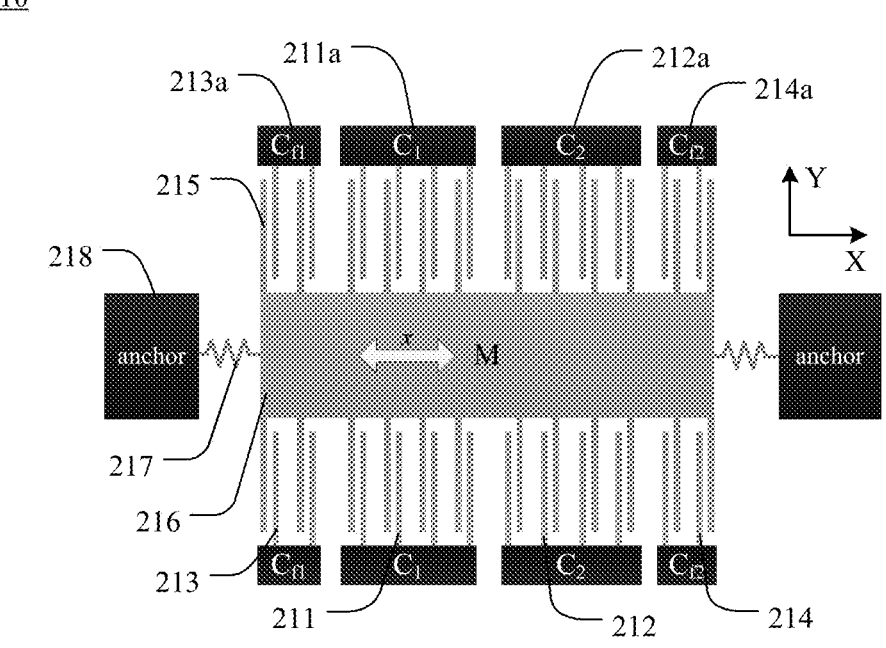
FIG. 4 shows a schematic structural diagram of an acceleration sensing element of the MEMS device according to the first embodiment of the present disclosure.
Figure 5:
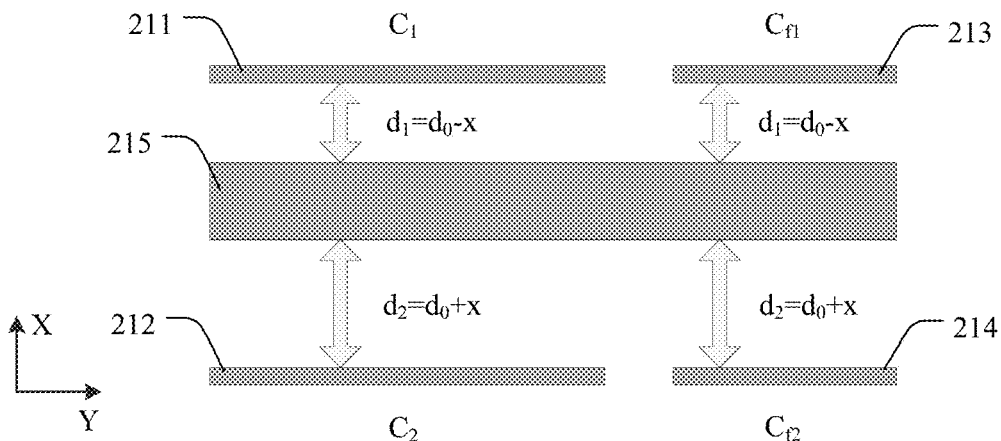
FIG. 5 shows a capacitive equivalent structure diagram of the acceleration sensing element of the MEMS device according to the first embodiment of the present disclosure.

FIG. 4 shows a schematic structural diagram of an acceleration sensing element of the MEMS device according to the first embodiment of the present disclosure; FIG. 5 shows a schematic diagram of a capacitive equivalent structure of the acceleration sensing element. As shown in FIGS. 4 and 5, the acceleration sensing element 210 includes a movable electrode plate 215, a first electrode plate 211, a second electrode plate 212, a first feedback electrode plate 213 and a second feedback electrode plate 214.

In this embodiment, there may be a plurality of movable electrode plates 215, and the plurality of movable electrode plates 215 are fixedly connected to a movable mass 216. Further, the movable mass 216 is a rectangular mass and the plurality of movable electrode plates 215 are perpendicular to the movable mass 216. Further, the movable mass 216 is connected to an anchor 218 through an elastic beam 217. When the acceleration sensing element 210 senses an acceleration, the elastic beam deflects in a first direction (e.g., X-axis direction), and the movable mass 216 is displaced in the first direction (e.g., the X-axis direction), thereby driving the plurality of movable electrode plates 215 to move together in the first direction (e.g., the X-axis direction).

The first electrode plate 211, the second electrode plate 212, the first feedback electrode plate 213, and the second feedback electrode plate 214 are fixed electrode plates. In this embodiment, there may be a plurality of first electrode plates 211, each of which is overlapped with a corresponding one of the plurality of movable electrode plates 215, and the plurality of first electrode plates 211 together with the corresponding ones of the plurality of movable electrode plates 215 constitute a first capacitor $C_1$. There may be a plurality of second electrode plates 212, each of which is overlapped with a corresponding one of the plurality of movable electrode plates 215, and the plurality of second electrode plates 212 together with the corresponding ones of the plurality of movable electrode plates 215 constitute a second capacitor $C_2$. There may be a plurality of first feedback electrode plates 213, each of which is overlapped with a corresponding one of the plurality of movable electrode plates 215, and the plurality of first feedback electrode plates 213 together with the corresponding ones of the plurality of movable electrode plates 215 constitute a first feedback capacitor $C_{f1}$. There may be a plurality of second feedback electrode plates 214, each of which is overlapped with a corresponding one of the plurality of movable electrode plates 215, and the plurality of second feedback electrode plates 214 together with the corresponding ones of the plurality of movable electrode plates 215 constitute a second feedback capacitor $C_{f2}$.

Each first electrode plate 211 is located on a first side of a corresponding movable electrode plate 215, each first feedback electrode plate 213 is located on a first side of a corresponding movable electrode plate 215, each second electrode plate 212 is located on a second side of a corresponding movable electrode plate 215, and each second feedback electrode plate 214 is located on a second side of a corresponding movable electrode plate 215. When the movable mass 216 is displaced to drive the movable electrode plates 215 close to the first electrode plates 211 and the first feedback electrode plates 213, corresponding movable electrode plates 215 move away from the second electrode plates 212 and the second feedback electrode plates 214; on the contrary, when the movable mass 216 is displaced to drive the movable electrode plates 215 away from the first electrode plates 211 and the first feedback electrode plates 213, the corresponding movable electrode plates 215 move close to the second electrode plates 212 and the second feedback electrode plates 214. When the movable mass 216 is displaced, the first capacitor $C_1$, the second capacitor $C_2$, the first feedback capacitor $C_{f1}$ and the second feedback capacitor $C_{f2}$ all change in capacitance.

When the movable mass 216 is in the nominal position, the distance between each first electrode plate 211 and a corresponding movable electrode plate 215, the distance between each second electrode plate 212 and a corresponding movable electrode plate 215, the distance between each first feedback electrode plate 213 and a corresponding movable electrode plate 215, and the distance between each second feedback electrode plate 214 and a corresponding movable electrode plate 215 are equal. The overlapped area of each first electrode plate 211 with a corresponding movable electrode plate 215, the overlapped area of each second electrode plate 212 with a corresponding movable electrode plate 215 are equal. The overlapped area of each first feedback electrode plate 213 with a corresponding movable electrode plate 215, and the overlapped area of each second feedback electrode plate 214 with a corresponding movable electrode plate 215 are equal. The number of the first electrode plates 211 is equal to the number of the second electrode plates 212. When the movable mass 216 is in the nominal position, capacitance values of the first capacitor $C_1$ and the second capacitor $C_2$ are equal, and for example, equal to $C_0$; the number of the first feedback electrode plates 213 is equal to the number of the second feedback electrode plates 214. When the movable mass 216 is in the nominal position, capacitance values of the first feedback capacitor $C_{f1}$ and the second feedback capacitor $C_{f2}$ are equal, and for example, equal to $C_f$.

The plurality of first electrode plates 211 are fixedly connected to one or more first fixed electrode 211a, wherein when there are a plurality of first fixed electrodes 211a, the plurality of first fixed electrodes 211a are short-circuited with each other. The plurality of the second electrode plates 212 are fixedly connected to one or more second fixed electrodes 212a, wherein when there are a plurality of second fixed electrodes 212a, the plurality of second fixed electrodes 212a are short-circuited with each other. The plurality of the first feedback electrode plates 213 are fixedly connected to one or more third fixed electrodes 213a, wherein when there are a plurality of third fixed electrodes 213a, the plurality of third fixed electrodes 213a are short-circuited with each other. The plurality of the second feedback electrode plates 214 are fixedly connected to one or more fourth fixed electrodes 214a, wherein when there are a plurality of fourth fixed electrodes 214a, the plurality of fourth fixed electrodes 214a are short-circuited with each other.

Figure 6:
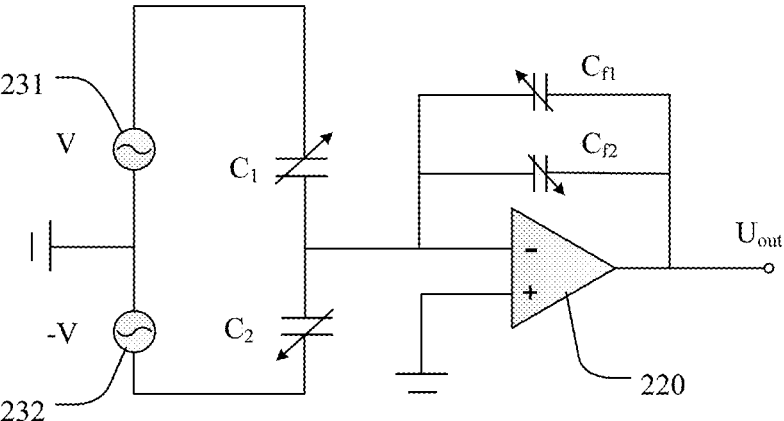
FIG. 6 shows an equivalent circuit diagram of the MEMS device according to the first embodiment of the present disclosure.

FIG. 6 shows an equivalent circuit diagram of the MEMS device according to the first embodiment of the present disclosure. As shown in FIGS. 3 and 6, the first capacitor $C_1$, the second capacitor $C_2$, the first voltage source 231, the second voltage source 232, and the operational amplifier 220 are connected to form a detection circuit. Specifically, the first electrode plate 211 is connected to the first voltage source 231 via the first fixed electrode 211a, the second electrode plate 212 is connected to the second voltage source 232 via the second fixed electrode 212a, and the movable electrode plate 215 is connected to an inverting input terminal of the operational amplifier 220 via the anchor 218, such that the first capacitor $C_1$ is connected between the first voltage source 231 and the inverting input terminal of the operational amplifier 220, and the second capacitor $C_2$ is connected between the second voltage source 232 and the inverting input terminal of the operational amplifier 220. The first voltage source 231 supplies a first voltage to the first capacitor $C_1$, and the second voltage source 232 supplies a second voltage to the second capacitor $C_2$. The voltages supplied by the first voltage source and the second voltage source are same in frequency and amplitude, and are opposite in phase.

The first feedback capacitor $C_{f1}$, the second feedback capacitor $C_{f2}$ and the operational amplifier 220 are connected to form a feedback circuit. Specifically, the commonly used movable electrode plate 215 is connected to the inverting input terminal of the operational amplifier 220, the first feedback electrode plate 213 is connected to an output terminal of the operational amplifier 220 via the third fixed electrode 213a, and the second feedback electrode plate 214 is connected to the output terminal of the operational amplifier 220 via the fourth fixed electrode 214a, so that the first feedback capacitor $C_{f1}$ and the second feedback capacitor $C_{f2}$ are connected between the inverting input terminal and the output terminal of the operational amplifier 220.

The detection circuit is used for performing differential detection on the first capacitor $C_1$ and the second capacitor $C_2$; the feedback circuit is used for decreasing or eliminating nonlinear relationship between an output voltage of the detection circuit and a displacement of the movable electrode plate. Specifically, an output voltage $U_{out}$ at the output terminal of the operational amplifier 220 is:

$$U_{out} = -\left(\frac{C_1}{C_{f1} + C_{f2}} V - \frac{C_2}{C_{f1} + C_{f2}} V\right)$$

When the movable electrode plate 215 is relatively in a nominal position, the capacitances of the first capacitor $C_1$, the second capacitor $C_2$, the first feedback capacitor $C_{f1}$ and the second feedback capacitor $C_{f2}$ are:

$$C_1 = \frac{\varepsilon A_0}{d_0};$$

$$C_2 = \frac{\varepsilon A_0}{d_0};$$

$$C_{f1} = \frac{\varepsilon A_f}{d_0};$$

$$C_{f2} = \frac{\varepsilon A_f}{d_0};$$

wherein the distance between the first electrode plate 211 and the movable electrode plate 215, the distance between the second electrode plate 212 and the movable electrode plate 215, the distance between the first feedback electrode plate 213 and the movable electrode plate 215, and the distance between the second feedback electrode plate 214 and the movable electrode plate 215 are each represented by $d_0$; $A_0$ represents a sum of the overlapped areas between the plurality of first electrode plates 211 and the plurality of movable electrode plates 215, and also represents a sum of the overlapped areas between the plurality of second electrode plates 212 and the plurality of movable electrode plates 215; $A_f$ represents a sum of the overlapped areas between the plurality of first feedback electrode plates 213 and the plurality of movable electrode plates 215, and also represents a sum of the overlapped areas between the plurality of second feedback electrode plates 214 and the plurality of movable electrode plates 215. It can be seen from the above formula that the capacitances of the first capacitor $C_1$ and the second capacitor $C_2$ are equal; and the capacitances of the first feedback capacitor $C_{f1}$ and the second feedback capacitor $C_{f2}$ are equal, and the output voltage $U_{out}$ of the detection circuit is 0.

When the movable electrode plate 215 is displaced along the first direction (e.g., the X-axis direction), the distance between the movable electrode plate 215 and the first electrode plate 211, the distance between the movable electrode plate 215 and the second electrode plate 212, the distance between the movable electrode plate 215 and the first feedback electrode plate 213, and the distance between the movable electrode plate 215 and the second feedback electrode plate 214 may change, thereby causing the capacitances of the first capacitor $C_1$, the second capacitor $C_2$, the first feedback capacitor $C_{f1}$, and the second feedback capacitor $C_{f2}$ to change.

When the movable electrode plate 215, for example, moves close to the first electrode plate 211 by a displacement x, the distance between the movable electrode plate 215 and the first electrode plate 211 is $d_0-x$, and the distance between the movable electrode plate 215 and the first feedback electrode plate 213 is $d_0-x$; meanwhile, the distance between the movable electrode plate 215 and the second electrode plate 212 is $d_0+x$, and the distance between the movable electrode plate 215 and the second feedback electrode plate 214 is $d_0+x$; and the first capacitor $C_1$, the second capacitor $C_2$, the first feedback capacitor $C_{f1}$ and the second feedback capacitor $C_{f2}$ are changed in capacitance, specifically:

$$C_1 = \frac{\varepsilon A_0}{d_0 - x};$$

$$C_2 = \frac{\varepsilon A_0}{d_0 + x};$$

$$C_{f1} = \frac{\varepsilon A_f}{d_0 - x};$$

$$C_{f2} = \frac{\varepsilon A_f}{d_0 + x};$$

The output voltage $U_{out}$ at the output terminal of the operational amplifier is:

$$U_{out} = -\left(\frac{C_1}{C_{f1} + C_{f2}} V - \frac{C_2}{C_{f1} + C_{f2}} V\right) = -\frac{\frac{\varepsilon A_0}{d_0 - x}}{\frac{\varepsilon A_f}{d_0 - x} + \frac{\varepsilon A_f}{d_0 + x}} V + \frac{\frac{\varepsilon A_0}{d_0 + x}}{\frac{\varepsilon A_f}{d_0 - x} + \frac{\varepsilon A_f}{d_0 + x}} V$$

The above formula can be simplified as:

$$U_{out} = -\frac{A_0 V}{A_f} \frac{x}{d_0}$$

It can be seen from the above formula that the output voltage $U_{out}$ of the detection circuit is proportional to the displacement of the movable electrode plate 215, that is, the output voltage $U_{out}$ of the detection circuit changes linearly with the displacement of the movable electrode plate 215.

Figure 7A:
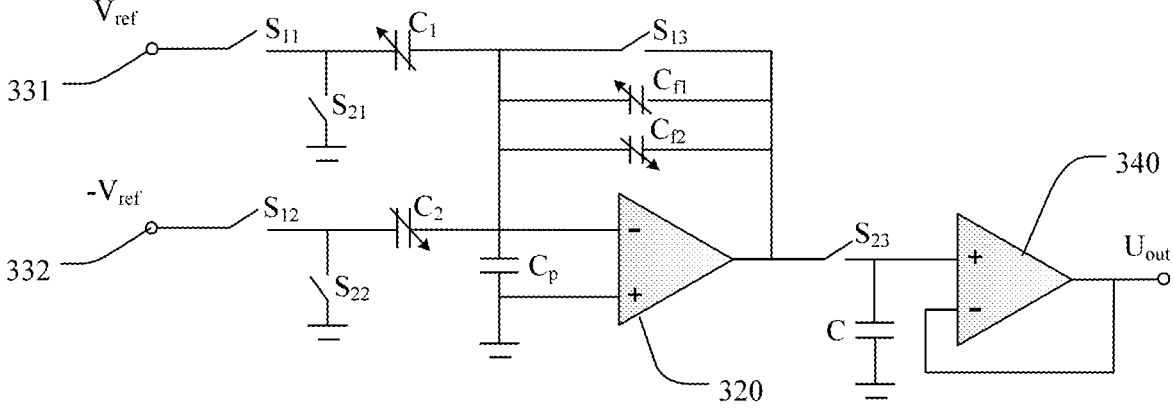
FIG. 7A shows an equivalent circuit diagram of a MEMS device according to a second embodiment of the present disclosure.

FIG. 7A shows an equivalent circuit diagram of a MEMS device according to a second embodiment of the present disclosure. In this embodiment, the MEMS device 300 includes an acceleration sensing element 310, an operational amplifier 320, a sample-and-hold device 340, a first voltage source 331, a second voltage source 332, a decoupling capacitor $C_p$, and an electronic analog switch for controlling timing. The acceleration sensing element 310 has a same structure with that of the acceleration sensing element 210 in the first embodiment, and will not be described in detail in the present embodiment. As shown in FIG. 7A, the first capacitor $C_1$, the second capacitor $C_2$, the first voltage source 331, the second voltage source 332 and the operational amplifier 320 are connected to form a detection circuit. The first feedback capacitor $C_{f1}$, the second feedback capacitor $C_{f2}$ and the operational amplifier 320 are connected to form a feedback circuit.

Different from the previous circuit, in this circuit, the first voltage source 331 supplies a first voltage to the first capacitor $C_1$, and the second voltage source 332 supplies a second voltage to the second capacitor $C_2$, the first voltage and the second voltage are constant voltages, and are same in amplitude and opposite in phase. The first voltage is, for example, $V_{ref}$, and the second voltage is, for example, $-V_{ref}$. Further, an output terminal of the operational amplifier 320 is connected to a non-inverting input terminal of the sample-and-hold device 340.

The electronic analog switch includes a plurality of first analog switches S1 and a plurality of second analog switches S2. The plurality of first analog switches S1 are identical in timing, and the plurality of second analog switches S2 are identical in timing.

In this embodiment, the plurality of first analog switches S1 are respectively a first analog switch S11, a first analog switch S12 and a first analog switch S13; the first analog switch S11 is connected between the first voltage source 331 and the first capacitor $C_1$, the first analog switch S12 is connected between the second voltage source 332 and the second capacitor $C_2$, and the first analog switch S13 is connected between the inverting input terminal and the output terminal of the operational amplifier 320.

The plurality of second analog switches S2 are respectively a second analog switch S21, a second analog switch S22 and a second analog switch S23; the second analog switch S21 is connected between the first capacitor $C_1$ and ground, the second analog switch S22 is connected between the second capacitor $C_2$ and ground, and the second analog switch S23 is connected between the output terminal of the operational amplifier 320 and the non-inverting input terminal of the sample-and-hold device 340.

In the MEMS device of this embodiment, in operation, the first capacitor $C_1$ and the second capacitor $C_2$ of the acceleration sensing element 310 are charged first, and then the first capacitor $C_1$ and the second capacitor $C_2$ are discharged. The charging and discharging processes of the first capacitor $C_1$ and the second capacitor $C_2$ are controlled by a certain timing and repeated continuously, so that the first capacitor $C_1$ and the second capacitor $C_2$ are always operated in dynamic charging and discharging processes. Continuous discharge current pulses of the first capacitor $C_1$ and the second capacitor $C_2$ are converted into voltages through the operational amplifier 320 and then pass through the sample-and-hold device 340 to generate the output voltage $U_{out}$.

Figure 7B:
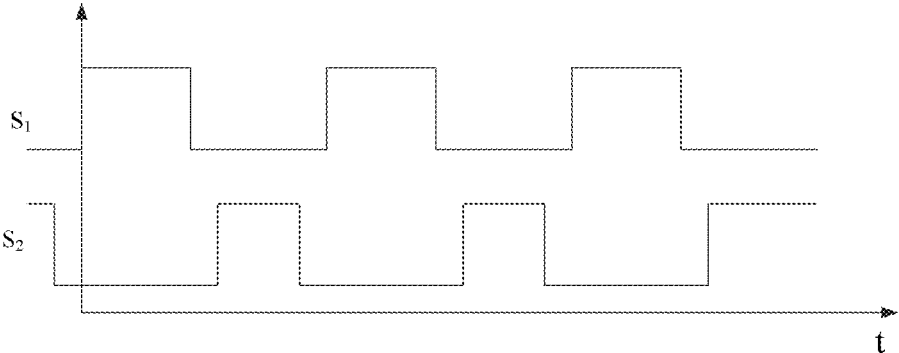
FIG. 7B is a schematic diagram showing the timing of the first analog switch S1 and the timing of the second analog switch S2 according to the second embodiment of the present disclosure.

The timing of the first analog switch S1 and the timing of the second analog switch S2 are shown in FIG. 7B. Referring to FIG. 7B, a whole measurement process of the MEMS device is completed by two steps:

When the first analog switch S1 (including the first analog switch S11, the first analog switch S12 and the first analog switch S13) is in a turn-on state (i.e., the first analog switch S1=ON) and the second analog switch S2 (including the second analog switch S21, the second analog switch S22 and the second analog switch S23) is in a turn-off state (i.e., the second analog switch S2=OFF), the first capacitor $C_1$ and the second capacitor $C_2$ are charged, and charge quantity is $V_{ref}C_1-V_{ref}C_2$, the first feedback capacitor $C_{f1}$ and the second feedback capacitor $C_{f2}$ are discharged, and charge quantity on the first feedback capacitor $C_{f1}$ and the second feedback capacitor $C_{f2}$ is 0, which is equivalent to a situation that the first feedback capacitor $C_{f1}$ and the second feedback capacitor $C_{f2}$ are reset;

when the first analog switch S1 (including the first analog switch S11, the first analog switch S12, and the first analog switch S13) is in a turn-off state (i.e., the first analog switch S1=OFF) and the second analog switch S2 (including the second analog switch S21, the second analog switch S22, and the second analog switch S23) is in a turn-on state (i.e., the second analog switch S2=ON), the first capacitor $C_1$ and the second capacitor $C_2$ are discharged. Charges of the first capacitor $C_1$ and the second capacitor $C_2$ are transferred to the first feedback capacitor $C_{f1}$ and the second feedback capacitor $C_{f2}$; the sample-and-hold device samples and holds $U_{out}$; according to charge conservation principle $V_{ref}$ $(C_1-C_2)=V_{ref}$ $(C_{f1}+C_{f2})$, it can be obtained that:

$$U_{out} = \frac{V_{ref}}{C_{f1}+C_{f2}}(C_1 - C_2) = \left( \frac{\dfrac{\varepsilon A_0}{d_0 - x} - \dfrac{\varepsilon A_0}{d_0 + x}}{\dfrac{\varepsilon A_f}{d_0 - x} + \dfrac{\varepsilon A_f}{d_0 + x}} \right) V_{ref}$$

The above formula can be simplified as:

$$U_{out} = \frac{A_0 V_{ref}}{A_f} \frac{x}{d_0}$$

Further, in this embodiment, the MEMS device further includes a decoupling capacitor $C_p$, one end of which is connected to the inverting input terminal of the operational amplifier 320, and the other end of the decoupling capacitor $C_p$ is grounded. When a discharge current pulse flows through a dynamic input resistor of the operational amplifier 320, a transient voltage spike may be generated at the input terminal of the operational amplifier. The decoupling capacitor $C_p$ introduced between the inverting input terminal of the operational amplifier 320 and ground can absorb voltage spike, so as to ensure a good ground potential at the inverting input terminal of the operational amplifier 320, and does not affect charge measurement.

Figure 8:
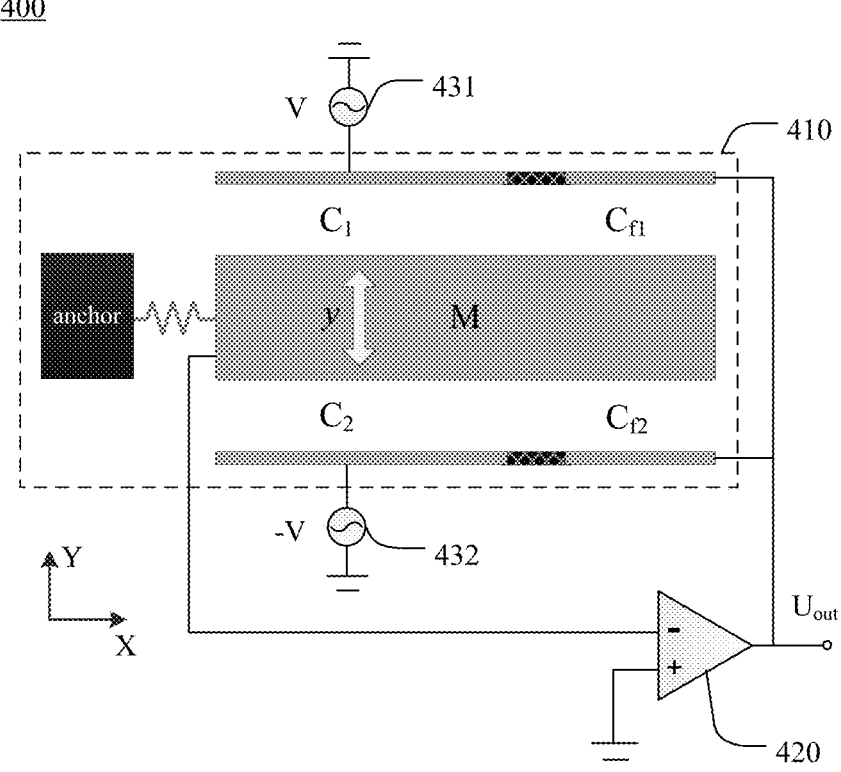
FIG. 8 shows a schematic diagram of a MEMS device according to a third embodiment of the present disclosure.

FIG. 8 shows a schematic structural diagram of the MEMS device according to a third embodiment of the present disclosure. As shown in FIG. 8, the MEMS device 400 includes an acceleration sensing element 410, an operational amplifier 420, a first voltage source 431, and a second voltage source 432.

Figure 9:
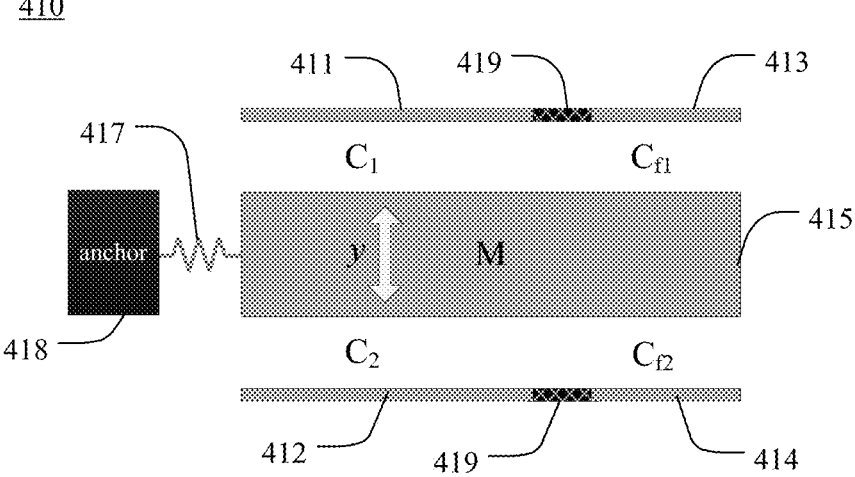
FIG. 9 shows a schematic structural diagram of an acceleration sensing element of a MEMS device according to the third embodiment of the present disclosure.

FIG. 9 shows a schematic structural diagram of the acceleration sensing element of the MEMS device according to the third embodiment of the present disclosure. The acceleration sensing element 410 includes a movable electrode plate 415, a first electrode plate 411, a second electrode plate 412, a first feedback electrode plate 413, and a second feedback electrode plate 414. The first electrode plate 411 and the first feedback electrode plate 413 are located on one side of the movable electrode plate 415, the second electrode plate 412 and the second feedback electrode plate 414 are located on the other side of the movable electrode plate 415, a first capacitor $C_1$ is formed between the first electrode plate 411 and the movable electrode plate 415, a second capacitor $C_2$ is formed between the second electrode plate 412 and the movable electrode plate 415, a first feedback capacitor $C_{f1}$ is formed between the first feedback electrode plate 413 and the movable electrode plate 415, and a second feedback capacitor $C_{f2}$ is formed between the second feedback electrode plate 414 and the movable electrode plate 415.

Different from the first embodiment, the first electrode plate 411 and the first feedback electrode plate 413 are connected together via an insulating medium 419; the second electrode plate 412 and the second feedback electrode plate 414 are connected together via an insulating medium 419. The movable electrode plate 415 is connected to an anchor 418 via an elastic beam 417, and when the MEMS device is subjected to acceleration in Y-axis direction, the movable electrode plate 415 moves along the Y-axis direction, so that the first capacitor $C_1$, the second capacitor $C_2$, the first feedback capacitor $C_{f1}$, and the second feedback capacitor $C_{f2}$ may change in capacitance.

The first capacitor $C_1$, the second capacitor $C_2$, the first voltage source 431, the second voltage source 432, and the operational amplifier 420 are connected to form a detection circuit. The first feedback capacitor $C_{f1}$, the second feedback capacitor $C_{f2}$ and the operational amplifier 420 are connected to form a feedback circuit. Connection configuration of the detection circuit and the feedback circuit may be the same as that of the first embodiment, and will not be described in this embodiment here.

Figure 10:
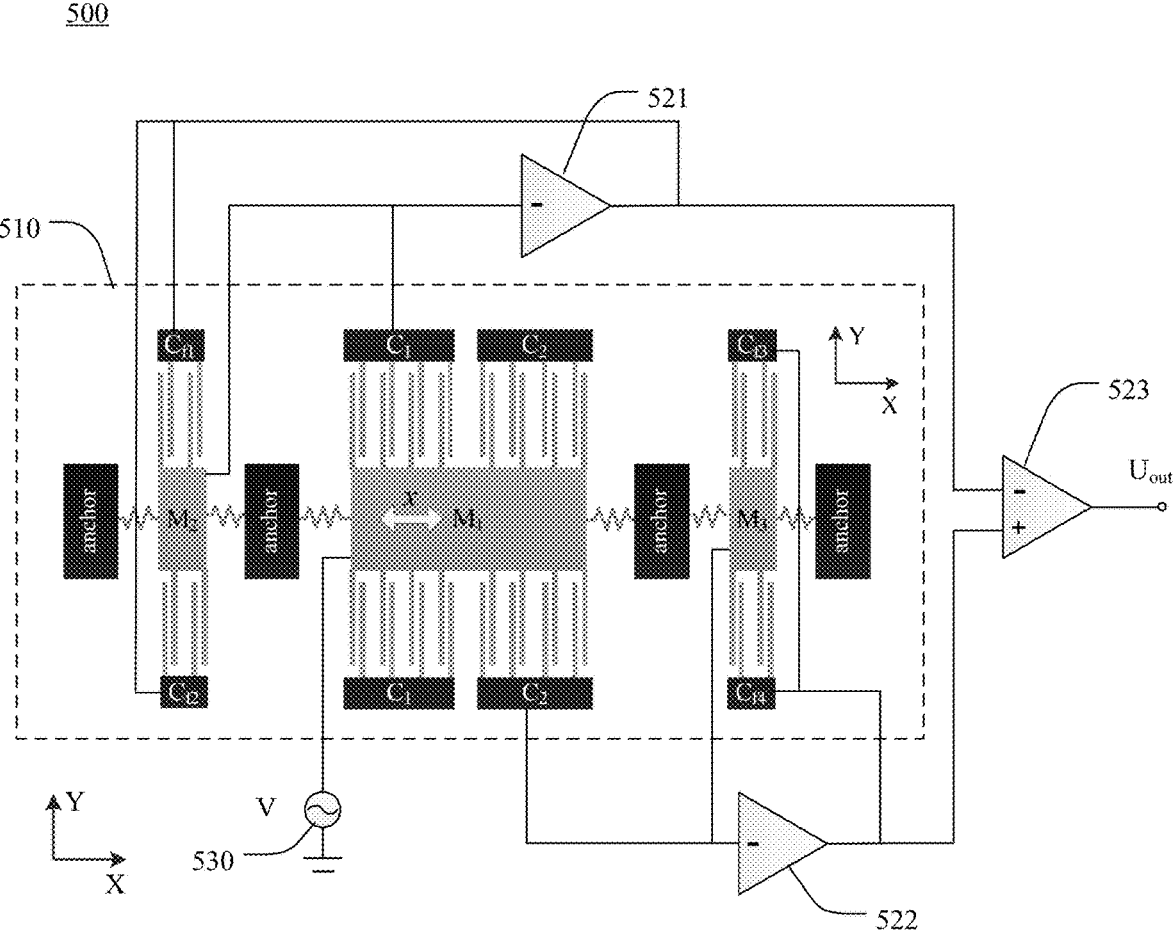
FIG. 10 shows a schematic diagram of a MEMS device according to a fourth embodiment of the present disclosure.

FIG. 10 shows a schematic diagram of a MEMS device according to a fourth embodiment of the present disclosure. In this embodiment, the MEMS device is, for example, a MEMS accelerometer. As shown in FIG. 10, the MEMS device 500 includes an acceleration sensing element 510, a first operational amplifier 521, a second operational amplifier 522, a third operational amplifier 523 and a voltage source 530.

Figure 11:
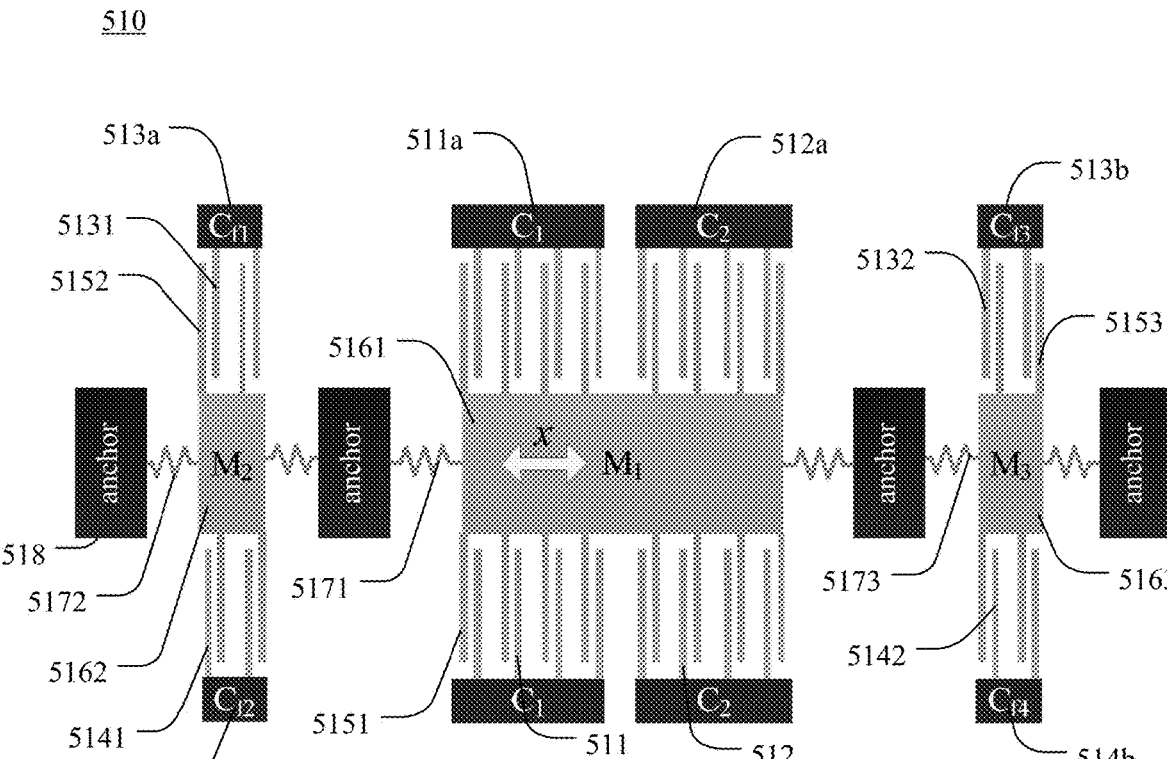
FIG. 11 shows a schematic structural diagram of an acceleration sensing element of the MEMS device according to the fourth embodiment of the present disclosure.

FIG. 11 shows a schematic structural diagram of the acceleration sensing element of the MEMS device according to the fourth embodiment of the present disclosure. As shown in FIG. 11, the acceleration sensing element 510 includes a first movable electrode plate 5151, a second movable electrode plate 5152, a third movable electrode plate 5153, a first electrode plate 511, a second electrode plate 512, a first feedback electrode plate 5131, a second feedback electrode plate 5141, a third feedback electrode plate 5132, and a fourth feedback electrode plate 5142.

In this embodiment, there may be a plurality of first movable electrode plates 5151, a plurality of second movable electrode plates 5152 and a plurality of third movable electrode plates 5153, the plurality of first movable electrode plates 5151 may be fixedly connected to the first movable mass 5161, the plurality of second movable electrode plates 5152 may be fixedly connected to the second movable mass 5162, and the plurality of third movable electrode plates 5153 may be fixedly connected to the third movable mass 5163. Further, the first movable mass 5161, the second movable mass 5162 and the third movable mass 5163 may each be a rectangular mass, the plurality of first movable electrode plates 5151 may be perpendicular to the first movable mass 5161, the plurality of second movable electrode plates 5152 may be perpendicular to the second movable mass 5162, and the plurality of third movable electrode plates 5153 may be perpendicular to the third movable mass 5163. Further, the first movable mass 5161, the second movable mass 5162, and the third movable mass 5163 are connected to an anchor 518 through elastic beams 5171, 5172, and 5173, respectively. Furthermore, operating modal frequencies (i.e., eigenfrequencies along X-axis direction) of the three movable mass-elastic beam-damping systems (5161-5171, 5162-5172 and 5163-5173) are designed to be equal or as close as possible. When the acceleration sensing element 510 senses acceleration, the elastic beam deflects in a first direction (e.g., X-axis direction), and the first movable mass 5161, the second movable mass 5162 and the third movable mass 5163 are synchronously displaced along the first direction (e.g., the X-axis direction) with a same direction and amplitude, thereby driving the first movable electrode plate 5151, the second movable electrode plate 5152 and the third movable electrode plate 5153 to move synchronously along the first direction (e.g., the X-axis direction) with the same direction and amplitude.

The first electrode plate 511, the second electrode plate 512, the first feedback electrode plate 5131, the second feedback electrode plate 5141, the third feedback electrode plate 5132, and the fourth feedback electrode plate 5142 are fixed electrode plates. In this embodiment, there may be a plurality of first electrode plates 511, each of which is overlapped with a corresponding first movable electrode plate 5151, and the plurality of first electrode plates 511 together with the corresponding ones of the plurality of first movable electrode plates 5151 constitute a first capacitor $C_1$. There may be a plurality of second electrode plates 512, each of which is overlapped with a corresponding first movable electrode plate 5151, and the plurality of second electrode plates 512 together with the corresponding ones of the plurality of first movable electrode plates 5151 constitute a second capacitor $C_2$. There may be a plurality of first feedback electrode plates 5131, each of which is overlapped with a corresponding second movable electrode plate 5152, and the plurality of first feedback electrode plates 5131 together with the corresponding ones of the plurality of second movable electrode plates 5152 constitute a first feedback capacitor $C_{f1}$. There may be a plurality of second feedback electrode plates 5141, each of which is overlapped with a corresponding second movable electrode plate 5152, and the plurality of second feedback electrode plates 5141 together with the corresponding ones of the plurality of second movable electrode plates 5152 constitute a first feedback capacitor $C_{f2}$. There may be a plurality of third feedback electrode plates 5132, each of which is overlapped with a corresponding third movable electrode plate 5153, and the plurality of third feedback electrode plates 5132 together with the corresponding ones of the plurality of third movable electrode plates 5153 constitute a third feedback capacitor $C_{f3}$. There may be a plurality of fourth feedback electrode plates 5142, each of which is overlapped with a corresponding third movable electrode plate 5153, and the plurality of the fourth feedback electrode plates 5142 together with the corresponding ones of the plurality of third movable electrode plates 5153 constitute a fourth feedback capacitor $C_{f4}$.

Each first electrode plate 511 is located on a first side of a corresponding first movable electrode plate 5151, and each second electrode plate 512 is located on a second side of a corresponding first movable electrode plate 5151; each first feedback electrode plate 5131 is located on a first side of a corresponding second movable electrode plate 5152, each second feedback electrode plate 5141 is located on a second side of a corresponding second movable electrode plate 5152, each third feedback electrode plate 5132 is located on a second side of a corresponding third movable electrode plate 5153, and each fourth feedback electrode plate 5142 is located on a first side of a corresponding third movable electrode plate 5153. The first side of each first movable electrode plate 5151, the first side of each second movable electrode plate 5152 and the first side of each third movable electrode plate 5153 are same sides.

When the first movable mass 5161, the second movable mass 5162 and the third movable mass 5163 are synchronously displaced to drive the first movable electrode plate 5151 close to the first electrode plate 511, drive the second movable electrode plate 5152 close to the first feedback electrode plate 5131, and drive the third movable electrode plate 5153 close to the fourth feedback electrode plate 5142, the first movable electrode plate 5151 is driven away from the second electrode plate 512, the second movable electrode plate 5152 is driven away from the second feedback electrode plate 5141, and the third movable electrode plate 5153 is driven away from the third feedback electrode plate 5132; on the contrary, when the first movable mass 5161, the second movable mass 5162 and the third movable mass 5163 are synchronously displaced to drive the first movable electrode plate 5151 away from the first electrode plate 511, drive the second movable electrode plate 5152 away from the first feedback electrode plate 5131, and drive the third movable electrode plate 5153 away from the fourth feedback electrode plate 5142, the first movable electrode plate 5151 is driven close to the second electrode plate 512, the second movable electrode plate 5152 is driven close to the second feedback electrode plate 5141, and the third movable electrode plate 5153 is driven close to the third feedback electrode plate 5132. That is, when the first movable mass 5161, the second movable mass 5162 and the third movable mass 5163 are synchronously displaced, the first capacitor $C_1$, the second capacitor $C_2$, the first feedback capacitor $C_{f1}$, the second feedback capacitor $C_{f2}$, the third feedback capacitor $C_{f3}$ and the fourth feedback capacitor $C_{f4}$ all change in capacitance.

When the first movable mass 5161, the second movable mass 5162 and the third movable mass 5163 are in a nominal position, the distance between each first electrode plate 511 and the corresponding first movable electrode plate 5151, the distance between each second electrode plate 512 and the corresponding first movable electrode plate 5151, the distance between each first feedback electrode plate 5131 and the corresponding second movable electrode plate 5152, the distance between each second feedback electrode plate 5141 and the corresponding second movable electrode plate 5152, the distance between each third feedback electrode plate 5132 and the corresponding third movable electrode plate 5153, and the distance between each fourth feedback electrode plate 5142 and the corresponding third movable electrode plate 5153 are equal. An overlapped area between each first electrode plate 511 and the corresponding first movable electrode plate 5151, an overlapped area between each second electrode plate 512 and the corresponding first movable electrode plate 5151, an overlapped area between each first feedback electrode plate 5131 and the corresponding second movable electrode plate 5152, an overlapped area between each second feedback electrode plate 5141 and the corresponding second movable electrode plate 5152, an overlapped area between each third feedback electrode plate 5132 and the corresponding third movable electrode plate 5153, and an overlapped area between each fourth feedback electrode plate 5142 and the corresponding third movable electrode plate 5153 are equal. The number of the first electrode plates 511 is equal to the number of the second electrode plates 512, such that when the first movable mass 5161 is in the nominal position, capacitances of the first capacitor $C_1$ and the second capacitor $C_2$ are equal, and for example, equal to $C_0$; the number of the first feedback electrode plates 5131, the number of the second feedback electrode plates 5141, the number of the third feedback electrode plates 5132, and the number of the fourth feedback electrode plates 5142 are equal, such that when the second movable mass 5162, and the third movable mass 5163 are in nominal positions, capacitances of the first feedback capacitor $C_{f1}$, the second feedback capacitor $C_{f2}$, the third feedback capacitor $C_{f3}$, and the fourth feedback capacitor $C_{f4}$ are equal, and for example, equal to $C_f$.

The plurality of the first electrode plates 511 are fixedly connected to one or more first fixed electrode 511a, wherein, when there are a plurality of first fixed electrodes 511a, the plurality of first fixed electrodes 511a are short-circuited with each other. The plurality of the second electrode plates 512 are fixedly connected to one or more second fixed electrode 512a, wherein, when there are a plurality of second fixed electrodes 512a, the plurality of second fixed electrodes 512a are short-circuited with each other. The plurality of the first feedback electrode plates 5131 are fixedly connected to one or more third fixed electrode 513a, wherein, when there are a plurality of third fixed electrodes 513a, the plurality of third fixed electrodes 513a are short-circuited with each other. The plurality of the second feedback electrode plates 5141 are fixedly connected to one or more fourth fixed electrode 514a, wherein, when there are a plurality of fourth fixed electrodes 514a, the plurality of fourth fixed electrodes 514a are short-circuited with each other. The plurality of the third feedback electrode plates 5132 are fixedly connected to one or more fifth fixed electrode 513b, wherein, when there are a plurality of fifth fixed electrodes 513b, the plurality of fifth fixed electrodes 513b are short-circuited with each other. The plurality of the fourth feedback electrode plates 5142 are fixedly connected to one or more sixth fixed electrode 514b, wherein, when there are a plurality of sixth fixed electrodes 514b, the plurality of sixth fixed electrodes 514b are short-circuited with each other.

Figure 12:
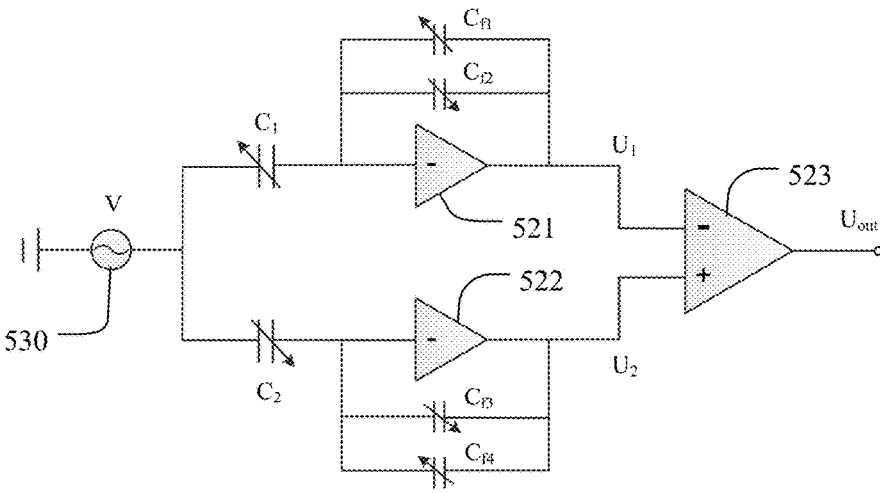
FIG. 12 shows an equivalent circuit diagram of the MEMS device according to the fourth embodiment of the present disclosure.

FIG. 12 shows an equivalent circuit diagram of the MEMS device according to the fourth embodiment of the present disclosure. As shown in FIGS. 10 and 12, the first capacitor $C_1$, the second capacitor $C_2$, the voltage source 530, the first operational amplifier 521, the second operational amplifier 522, and the third operational amplifier 523 are connected to form a detection circuit. Specifically, the voltage source 530 is connected to the first movable mass 5161, such that one end of the first capacitor $C_1$ and one end of the second capacitor $C_2$ are both connected with the voltage source 530; the first electrode plate 511 is connected to an inverting input terminal of the first operational amplifier 521 via the first fixed electrode 511a, and the second electrode plate 512 is connected to an inverting input terminal of the second operational amplifier 522 via the second fixed electrode 512a, that is, the first capacitor $C_1$ is connected between the voltage source 530 and the inverting input terminal of the first operational amplifier 521, and the second capacitor $C_2$ is connected between the voltage source 530 and the inverting input terminal of the second operational amplifier 522. The voltage source 530 supplies a same voltage to the first capacitor $C_1$ and the second capacitor $C_2$; an output terminal of the first operational amplifier 521 is connected to an inverting input terminal of the third operational amplifier 523; an output terminal of the second operational amplifier 522 is connected to a non-inverting input terminal of the third operational amplifier 523.

The first feedback capacitor $C_{f1}$, the second feedback capacitor $C_{f2}$, the third feedback capacitor $C_{f3}$ and the fourth feedback capacitor $C_{f4}$, the first operational amplifier 521 and the second operational amplifier 522 are connected to form a feedback circuit. Specifically, the second movable electrode plate 5152 is connected to the inverting input terminal or the output terminal of the first operational amplifier 521, the first feedback electrode plate 5131 is, via the third fixed electrode 513a, shorted with the second feedback electrode plate 5141 via the fourth fixed electrode 514a, and is correspondingly connected to the output terminal or the inverting input terminal of the first operational amplifier 521, that is, the first feedback capacitor $C_{f1}$ and the second feedback capacitor $C_{f2}$ are connected between the inverting input terminal and the output terminal of the first operational amplifier 521 to constitute a first feedback circuit; the third movable electrode plate 5153 is connected to the inverting input terminal or the output terminal of the second operational amplifier 522, and the third feedback electrode plate 5132 is, via the fifth fixed electrode 513*b*, shorted with the fourth feedback electrode plate 5142 via the sixth fixed electrode 514*b*, and is connected to the output terminal or the inverting input terminal of the second operational amplifier 522, so that the third feedback capacitor $C_{f3}$ and the fourth feedback capacitor $C_{f4}$ are connected between the inverting input terminal and the output terminal of the second operational amplifier 522 to constitute a second feedback circuit.

The detection circuit is used for performing detection on the first capacitor $C_1$ and the second capacitor $C_2$; the feedback circuit is used for decreasing or eliminating non-linear relationship between an output voltage of the detection circuit and a displacement of the movable electrode plate. Specifically, an output voltage $U_{out}$ at the output terminal of the third operational amplifier 523 is:

$$U_{out} = U_1 - U_2 = -\frac{C_1}{C_{f1} + C_{f2}} V + \frac{C_2}{C_{f3} + C_{f4}} V$$

When the movable electrode plates 5151, 5152 and 5153 are in nominal positions, capacitances of the first capacitor $C_1$, the second capacitor $C_2$, the first feedback capacitor $C_{f1}$, the second feedback capacitor $C_{f2}$, the third feedback capacitor $C_{f3}$ and the fourth feedback capacitor $C_{f4}$ are:

$$C_1 = \frac{\varepsilon A_0}{d_0};$$

$$C_2 = \frac{\varepsilon A_0}{d_0};$$

$$C_{f1} = \frac{\varepsilon A_f}{d_0};$$

$$C_{f2} = \frac{\varepsilon A_f}{d_0};$$

$$C_{f3} = \frac{\varepsilon A_f}{d_0};$$

$$C_{f4} = \frac{\varepsilon A_f}{d_0};$$

wherein the distance between the first electrode plate 511 and the first movable electrode plate 5151, the distance between the second electrode plate 512 and the first movable electrode plate 5151, the distance between the first feedback electrode plate 5131 and the second movable electrode plate 5152, the distance between the second feedback electrode plate 5141 and the second movable electrode plate 5152, the distance between the third feedback electrode plate 5132 and the third movable electrode plate 5153, the distance between the fourth feedback electrode plate 5142 and the third movable electrode plate 5153 are each represented as $d_0$; a sum of the overlapped areas between the plurality of first electrode plates 511 and the plurality of first movable electrode plates 5151 and a sum of the overlapped areas between the plurality of first movable electrode plates 5151 and the plurality of second electrode plates 512 are each represented as $A_0$; a sum of the overlapped areas between the plurality of first feedback electrode plates 5131 and the plurality of second movable electrode plates 5152, a sum of the overlapped areas between the plurality of second feedback electrode plates 5141 and the plurality of second movable electrode plates 5152, a sum of the overlapped areas between the plurality of third feedback electrode plates 5132 and the plurality of third movable electrode plates 5153, and a sum of the overlapped areas between the plurality of fourth feedback electrode plates 5142 and the plurality of third movable electrode plates 5153 are each represented as $A_f$. It can be seen from the above formula that the capacitances of the first capacitor $C_1$ and the second capacitor $C_2$ are equal; the capacitances of the first feedback capacitor $C_{f1}$, the second feedback capacitor $C_{f2}$, the third feedback capacitor $C_{f3}$ and the fourth feedback capacitor $C_{f4}$ are equal, and the output voltage $U_{out}$ of the detection circuit is 0.

When the first movable electrode plate 5151, the second movable electrode plate 5152, and the third movable electrode plate 5153 are synchronously displaced along a first direction (e.g., X-axis direction), the distance between the first movable electrode plate 5151 and the first electrode plate 511, the distance between the first movable electrode plate 5151 and the second electrode plate 512, the distance between the second movable electrode plate 5152 and the first feedback electrode plate 5131, the distance between the second movable electrode plate 5152 and the second feedback capacitor 5141, the distance between the third movable electrode plate 5153 and the third feedback electrode plate 5132, and the distance between the third movable electrode plate 5153 and the fourth feedback electrode plate 5142 may be changed, thereby causing the first capacitor $C_1$, the second capacitor $C_2$, the first feedback capacitor $C_{f1}$, the second feedback capacitor $C_{f2}$, the third feedback capacitor $C_{f3}$, and the fourth feedback capacitor $C_{f4}$ to be changed in capacitance.

When the first movable electrode plate 5151, for example, moves close to the first electrode plate 511 by a displacement x, the distance between the first movable electrode plate 5151 and the first electrode plate 511 is $d_0-x$, and the distance between the second movable electrode plate 5152 and the first feedback electrode plate 5131 is $d_0-x$. The distance between the third movable electrode plate 5153 and the fourth feedback electrode plate 5142 is $d_0-x$; at the same time, the distance between the first movable electrode plate 5151 and the second electrode plate 512 is $d_0+x$, the distance between the second movable electrode plate 5152 and the second feedback electrode plate 5141 is $d_0+x$, the distance between the third movable electrode plate 5153 and the third feedback electrode plate 5132 is $d_0+x$; furthermore, the first capacitor $C_1$, the second capacitor $C_2$, the first feedback capacitor $C_{f1}$ the second feedback capacitor $C_{f2}$, the third feedback capacitor $C_{f3}$ and the fourth feedback capacitor $C_{f4}$ may be changed in capacitance, specifically:

$$C_1 = \frac{\varepsilon A_0}{d_0 - x};$$

$$C_2 = \frac{\varepsilon A_0}{d_0 + x};$$

$$C_{f1} = \frac{\varepsilon A_f}{d_0 - x};$$

-continued $$C_{f2} = \frac{\varepsilon A_f}{d_0 + x};$$

$$C_{f3} = \frac{\varepsilon A_f}{d_0 + x};$$

$$C_{f4} = \frac{\varepsilon A_f}{d_0 - x};$$

The output voltage $U_{out}$ at the output terminal of the operational amplifier 523 is:

$$U_{out} = U_1 - U_2 =$$

$$-\frac{C_1}{C_{f1} + C_{f2}}V + \frac{C_2}{C_{f3} + C_{f4}}V = -\frac{\dfrac{\varepsilon A_0}{d_0 - x}}{\dfrac{\varepsilon A_f}{d_0 - x} + \dfrac{\varepsilon A_f}{d_0 + x}}V + \frac{\dfrac{\varepsilon A_0}{d_0 + x}}{\dfrac{\varepsilon A_f}{d_0 + x} + \dfrac{\varepsilon A_f}{d_0 - x}}V$$

The above formula can be simplified as:

$$U_{out} = -\frac{A_0 V}{A_f}\frac{x}{d_0}$$

It can be seen from the above formula that the output voltage $U_{out}$ of the detection circuit is proportional to the displacement of the movable electrode plate, that is, the output voltage $U_{out}$ of the detection circuit is linear with the displacement of the movable electrode plate.

In the above four embodiments, each MEMS device may be a MEMS accelerometer, wherein the MEMS accelerometer can be equivalent to a parallel plate capacitor including a feedback capacitor. In other embodiments, the MEMS device may also be any other MEMS device, such as a MEMS gyroscope or the like, that may be equivalent to a parallel plate capacitor including a feedback capacitor.

Figure 13:
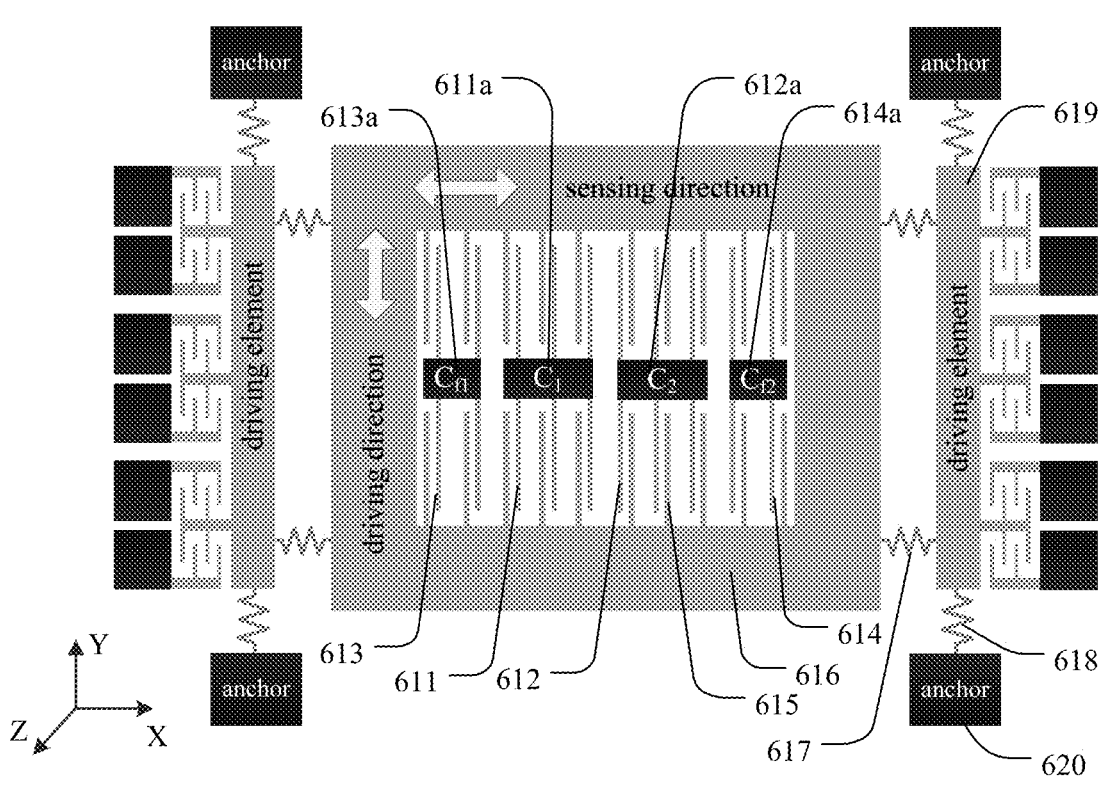
FIG. 13 shows a schematic structural diagram of a MEMS sensing element of a gyroscope.

FIG. 13 shows a schematic structural diagram of a MEMS sensing element 610 of a gyroscope, and the sensing element 610 includes a movable electrode plate 615, a first electrode plate 611, a second electrode plate 612, a first feedback electrode plate 613, and a second feedback electrode plate 614.

In this embodiment, the movable electrode plate 615, the first electrode plate 611, the second electrode plate 612, the first feedback electrode plate 613 and the second feedback electrode plate 614 can be arranged in a same manner as in the first embodiment, that is, the first capacitor $C_1$ is formed by the first electrode plate 611 and the movable electrode plate 615, the second capacitor $C_2$ is formed by the second electrode plate 612 and the movable electrode plate 615, the first feedback capacitor $C_{f1}$ is formed by the first feedback electrode plate 613 and the movable electrode plate 615, and the second feedback capacitor $C_{f2}$ is formed by the second feedback electrode plate 614 and the movable electrode plate 615.

Different from the first embodiment, in the present embodiment, there may be a plurality of movable electrode plates 615, which are fixedly connected to the movable mass 616. Further, the movable mass 616 can be an annular mass and the movable electrode plates 615 may be fixed to two opposite inner sidewalls of the annular movable mass 616. Further, the movable mass 616 is connected to a driving element 619 through an elastic beam 617, two ends of the driving element 619 are connected to an anchor 620 through an elastic beam 618, and the driving element 619 drives the movable mass 616 to vibrate harmonically in resonant frequency in the Y-axis direction under a driving force. When an angular velocity in Z-axis direction is input, Coriolis force in the X-axis direction is generated to cause a displacement x of the movable mass 616 and the movable electrode plate 615 in the X-axis direction.

When there is no angular velocity input, the movable mass 616 is in a nominal position in the X-axis direction, the number of the first electrode plates 611 is equal to the number of the second electrode plates 612, capacitances of the first capacitor $C_1$ and the second capacitor $C_2$ are equal, and for example, equal to $C_0$; the number of the first feedback electrode plates 613 is equal to the number of the second feedback electrode plates 614, and capacitances of the first feedback capacitor $C_{f1}$ and the second feedback capacitor $C_{f2}$ are equal, and for example, equal to $C_f$. When there is an angular velocity input in Z-axis direction, the movable mass 616 may produce a displacement x in the X-axis direction under Coriolis force. The first capacitor $C_1$, the second capacitor $C_2$, the first feedback capacitor $C_{f1}$ and the second feedback capacitor $C_{f2}$ may all be changed in capacitance.

The first capacitor $C_1$ and the second capacitor $C_2$ are connected to the detection circuit. The first feedback capacitor $C_{f1}$ and the second feedback capacitor $C_{f2}$ are connected to the feedback circuit. Connection configuration of the detection circuit and the feedback circuit may be the same as that of the first embodiment, and will not be described in this embodiment here.

In accordance with embodiments of the present disclosure, as described above, these embodiments are not exhaustively described in all detail nor are the present disclosure limited to the specific embodiments described. Obviously, according to the above descriptions, many modifications and changes can be made. These embodiments are selected and specifically described in this specification in order to better explain principles and practical applications of the present disclosure, thereby enabling those skilled in the art to make good use of the present disclosure and modifications based on the present disclosure. The invention is limited only by the claims and their full scope and equivalents.

What is claimed is:

1. A MEMS device, comprising:
   a movable electrode plate;
   a first electrode plate and a first feedback electrode plate, both of which are located on a first side of the movable electrode plate, wherein a first capacitor is formed by the first electrode plate and the movable electrode plate, and a first feedback capacitor is formed by the first feedback electrode plate and the movable electrode plate;
   a second electrode plate and a second feedback electrode plate, both of which are located on a second side of the movable electrode plate, wherein a second capacitor is formed by the second electrode plate and the movable electrode plate, and a second feedback capacitor is formed by the second feedback electrode plate and the movable electrode plate; and
   an operation amplifier;
   wherein the first capacitor and the second capacitor are coupled to an inverting input terminal of the operational amplifier, so as to form a detection circuit, and the detection circuit is configured for performing differential detection on the first capacitor and the second capacitor;

wherein the first feedback capacitor and the second feedback capacitor are coupled between an output terminal and the inverting input terminal of the operational amplifier, so as to form a feedback circuit, and the feedback circuit is configured for eliminating nonlinear relationship between an output voltage of the detection circuit and a displacement of the movable electrode plate.

2. The MEMS device according to claim 1, wherein the first electrode plate and the second electrode plate each have an equal overlapped area with the movable electrode plate; the first feedback electrode plate and the second feedback electrode plate each have an equal overlapped area with the movable electrode plate; when the movable electrode plate is in a nominal position, distance between the movable electrode plate and each of the first electrode plate, the second electrode plate, the first feedback electrode plate and the second feedback electrode plate is equal.

3. The MEMS device according to claim 1, wherein the detection circuit comprises:

a first voltage source, connected to the first electrode plate for supplying a first voltage to the first capacitor;

a second voltage source, connected to the second electrode plate for supplying a second voltage to the second capacitor;

the inverting input terminal of the operational amplifier, is connected to the movable electrode plate.

4. The MEMS device according to claim 3, wherein the first feedback electrode plate and the second feedback electrode plate are connected to the output terminal of the operational amplifier.

5. The MEMS device according to claim 4, wherein the first voltage and the second voltage are AC high frequency carriers, which are equal in amplitude and are opposite in phase.

6. The MEMS device according to claim 4, further comprising:

an electronic analog switch for timing control; and a sample-and-hold device, configured for sampling and holding an output voltage of the operational amplifier.

7. The MEMS device according to claim 6, wherein the electronic analog switch comprises a plurality of first electronic analog switches and a plurality of second electronic analog switches, wherein the plurality of first electronic analog switches are identical in timing, and the plurality of second electronic analog switches are identical in timing.

8. The MEMS device according to claim 7, wherein the plurality of first electronic analog switches are respectively connected between the first voltage source and the first capacitor, between the second voltage source and the second capacitor, and between an inverting input terminal and an output terminal of the operational amplifier; the plurality of second electronic analog switches are respectively connected between the first capacitor and ground, between the second capacitor and ground, and between the output terminal of the operational amplifier and a non-inverting input terminal of the sample-and-hold device.

9. The MEMS device according to claim 8, wherein the first voltage and the second voltage are constant voltages, and are equal in amplitude and opposite in phase.

10. A MEMS device, comprising:

a plurality of movable electrode plates, comprising a first movable electrode plate, a second movable electrode plate and a third movable electrode plate;

a first electrode plate, located on a first side of the first movable electrode plate, the first electrode plate and the first movable electrode plate forming a first capacitor;

a second electrode plate, located on a second side of the first movable electrode plate, the second electrode plate and the first movable electrode plate forming a second capacitor;

a first feedback electrode plate, located on a first side of the second movable electrode plate, the first feedback electrode plate and the second movable electrode plate forming a first feedback capacitor;

a second feedback electrode plate, located on a second side of the second movable electrode plate, the second feedback electrode plate and the second movable electrode plate forming a second feedback capacitor;

a third feedback electrode plate, located on a first side of the third movable electrode plate, the third feedback electrode plate and the third movable electrode plate forming a third feedback capacitor;

a fourth feedback electrode plate, located on a second side of the third movable electrode plate, the fourth feedback electrode plate and the third movable electrode plate forming a fourth feedback capacitor;

a first operational amplifier, a second operational amplifier, and a third operational amplifier;

wherein the first capacitor is coupled to an inverting input terminal of the first operational amplifier, the second capacitor is coupled to an inverting input terminal of the second operational amplifier, an output terminal of the first operational amplifier is coupled to an inverting input terminal of the third operational amplifier, and an output terminal of the second operational amplifier is coupled to a non-inverting input terminal of the third operational amplifier, so as to form a detection circuit; the detection circuit is configured to detect the first capacitor and the second capacitor;

wherein the first feedback capacitor and the second feedback capacitor are coupled between the inverting input terminal and the output terminal of the first operational amplifier, so as to form a first feedback circuit; the third feedback capacitor and the fourth feedback capacitor are coupled between the inverting input terminal and the output terminal of the second operational amplifier, so as to form a second feedback circuit;

wherein the first feedback circuit and the second feedback circuit are configured to eliminate a nonlinear relationship between an output voltage of the detection circuit and a displacement of one or more of the plurality of movable electrode plates.

11. The MEMS device according to claim 10, wherein the first electrode plate and the second electrode plate each have an equal overlapped area with the first movable electrode plate; an overlapped area between the second movable electrode plate and the first feedback electrode plate and the second feedback electrode plate are each equal to an overlapped area of the third feedback electrode plate to the third movable electrode plate and an overlapped area of the fourth feedback electrode plate to the third movable electrode plate; when the movable electrode plate is in a nominal position, distance between the movable electrode plate and each of the first electrode plate, the second electrode plate, the first feedback electrode plate, the second feedback electrode plate, the third feedback electrode plate and the fourth feedback electrode plate is equal.

12. The MEMS device according to claim 11, wherein the detection circuit comprises:

a voltage source, connected to the first movable electrode plate for supplying a voltage to the first capacitor and the second capacitor;

wherein the inverting input terminal of the first operational amplifier is connected to the first electrode plate; the inverting input terminal of the second operational amplifier is connected to the second electrode plate.

13. The MEMS device according to claim 12, wherein the first feedback electrode plate and the second feedback electrode plate are connected to the output terminal or the inverting input terminal of the first operational amplifier, and the second movable electrode plate is correspondingly connected to the inverting input terminal or the output terminal of the first operational amplifier; and the third feedback electrode plate and the fourth feedback electrode plate are connected to the output terminal or the inverting input terminal of the second operational amplifier, and the third movable electrode plate is correspondingly connected to the inverting input terminal or the output terminal of the second operational amplifier.

14. The MEMS device according to claim 1, wherein first electrode plate and the first feedback electrode plate are separated from each other or connected through an insulating medium; and the second electrode plate and the second feedback electrode plate are separated from each other or connected through an insulating medium.

15. The MEMS device according to claim 1, wherein the MEMS device is a MEMS accelerometer or a MEMS gyroscope.

16. The MEMS device according to claim 10, wherein the first electrode plate and the first feedback electrode plate are separated from each other or connected through an insulating medium; and the second electrode plate and the second feedback electrode plate are separated from each other or connected through an insulating medium.

17. The MEMS device according to claim 10, wherein the MEMS device is a MEMS accelerometer or a MEMS gyroscope.

18. The MEMS device according to claim 10, wherein the first movable electrode plate, the second movable electrode plate and the third movable electrode plate are separated from each other and move synchronously.

* * * * *